United States Patent [19]
Akiyama

[11] Patent Number: 6,011,914
[45] Date of Patent: Jan. 4, 2000

[54] METHOD FOR SIMULATING DIFFUSION OF IMPURITY MATERIALS IN SEMICONDUCTOR DEVICES

[75] Inventor: Yutaka Akiyama, Tokyo, Japan

[73] Assignee: NEC Corporation, Tokyo, Japan

[21] Appl. No.: 08/933,014

[22] Filed: Sep. 18, 1997

[30] Foreign Application Priority Data

Sep. 20, 1996 [JP] Japan .................................... 8-250096

[51] Int. Cl.⁷ .................................................. G06F 9/455
[52] U.S. Cl. ...................................................... 395/500.35
[58] Field of Search ........................... 364/578; 395/500, 395/500.26, 500.25, 500.34, 500.35; 345/425

[56] References Cited

U.S. PATENT DOCUMENTS

| | | | |
|---|---|---|---|
| 4,912,664 | 3/1990 | Weiss et al. ............................. | 364/578 |
| 5,677,846 | 10/1997 | Kumashiro ............................... | 345/425 |
| 5,774,696 | 6/1998 | Akiyama ................................. | 395/500 |

OTHER PUBLICATIONS

Morisue, "Designing and Manufacture Simulation of VLSI" CMC, pp. 51–62.

Dan, "Process, Device, and Simulation Technique", Sangyo Tosho, pp. 90–122.

C.S. Rafferty, "Iterative Methods of Semiconductor Device Simulation", IEEE Transactions on Electron Devices, vol. Ed–32, No. 10, oct. 1985, pp. 2018–2027.

M.S. Mock, "Tetrahedral Elements and the Scharferrer–Gummel Method", Proceedings of the NASECODE IV, 1985, pp. 36–47.

"Semiconductor Process—Device Simulation Technique" Realize Inc., 1990, pp. 79–89.

*Primary Examiner*—Kevin J. Teska
*Assistant Examiner*—Dan Fiul
*Attorney, Agent, or Firm*—Whitham, Curtis & Whitham

[57] ABSTRACT

A method for simulating the deformation of regions in a semiconductor device due to oxidation. An oxidation calculation triangular mesh is deformed according to an oxidation calculation, and a diffusion calculation triangular mesh simulates the diffusion of impurity materials. Diffusion calculation control volumes are defined to each vertex of the diffusion calculation triangular mesh. The diffusion calculation triangular mesh and the diffusion calculation control volumes are deformed according to the deformation of the oxidation calculation triangular mesh. Impurity material concentrations are altered according to volume ratio of the diffusion calculation control volume after deformation to the diffusion calculation control volume before deformation. A new diffusion calculation triangular mesh and corresponding new diffusion calculation control volumes are defined for deformed shapes of regions that guarantee Delaunay partitioning. The amount of the impurity material in the diffusion calculation control volumes after deformation is fully transferred to the new diffusion calculation control volumes. A diffusion calculation is executed using the new diffusion calculation control volumes and the impurity material concentrations on the new diffusion calculation triangular mesh. The above process is repeated for a predetermined period of time. The simulation conserves the gross dose of the impurity material with a high degree of accuracy and a short calculation time.

11 Claims, 10 Drawing Sheets

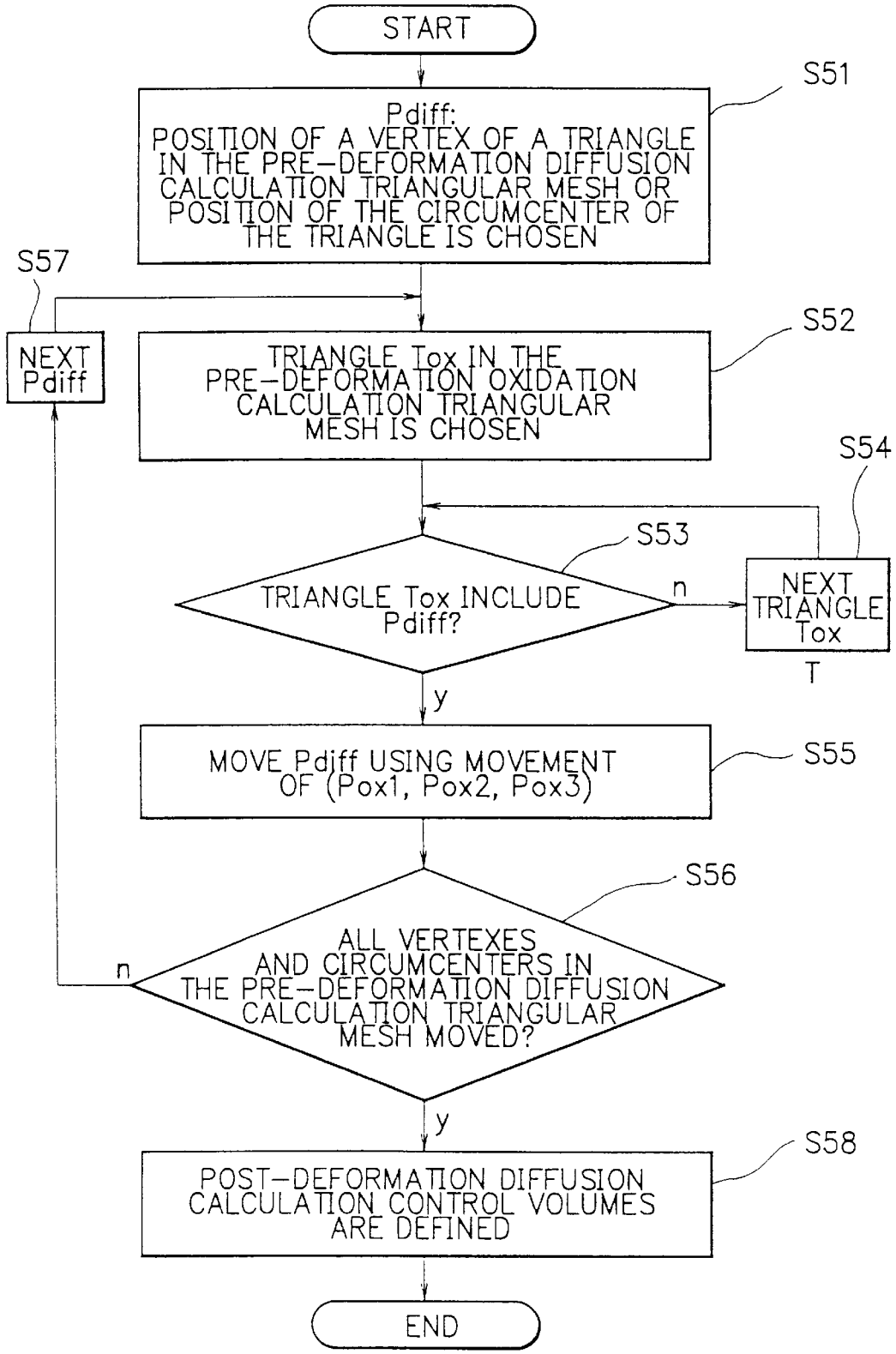

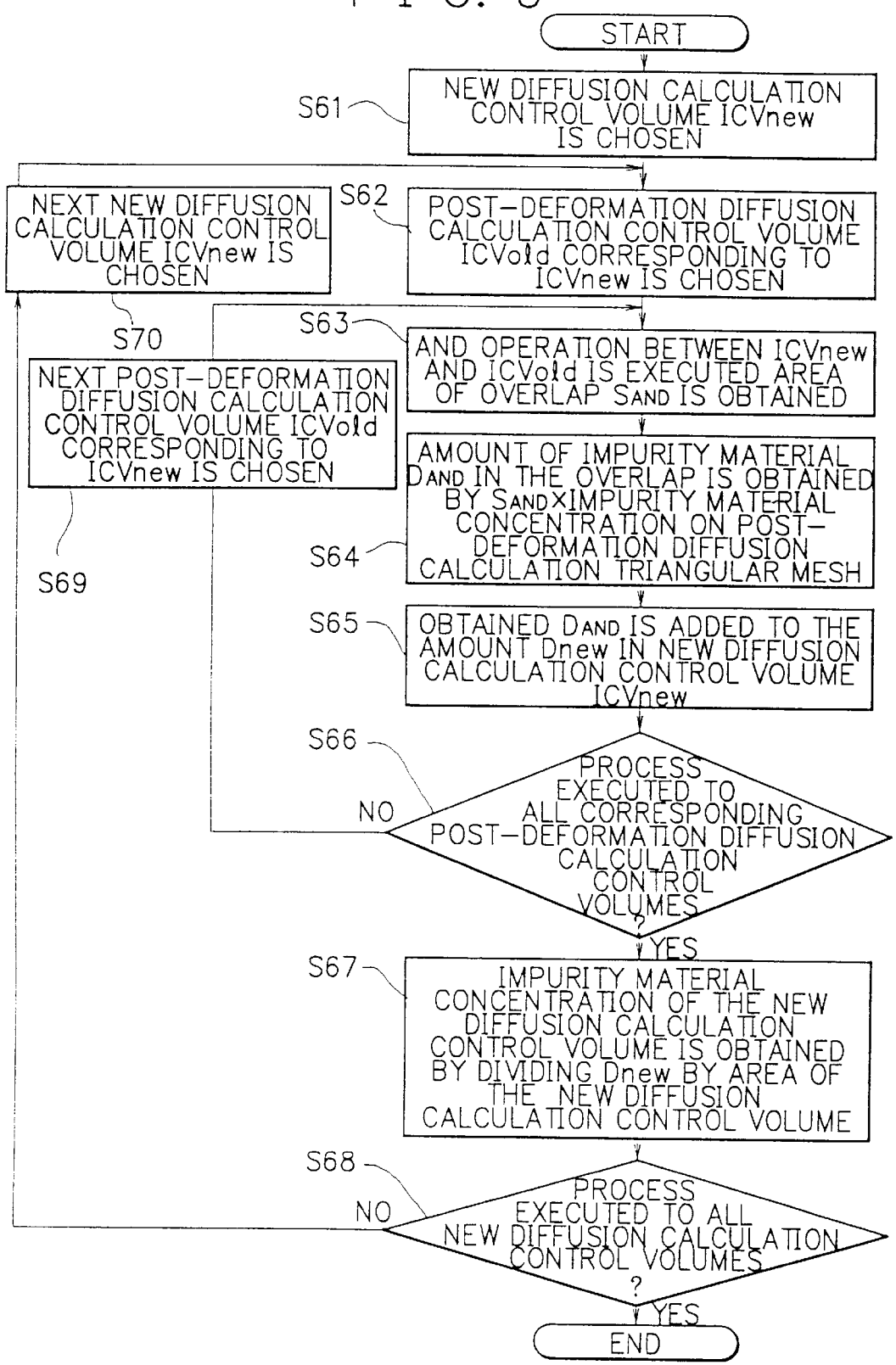

METHOD FOR SIMULATING DIFFUSION OF IMPURITY MATERIALS IN SEMICONDUCTOR DEVICES

BACKGROUND OF THE INVENTION

The present invention relates to a method for process simulation of a semiconductor device, and in particular, to a process simulation method in which process simulation keeping conservation of the gross amount of impurity materials in the device is possible with short calculation time even in the case where the shapes of regions of the semiconductor device vary due to oxidation calculation etc.

DESCRIPTION OF THE PRIOR ART

In the field of process simulation, process simulators are used on computer systems for calculating and simulating manufacturing processes of semiconductor devices such as an oxidation process, a diffusion process, an ion implantation process, etc. and predicting or estimating physical quantities or shapes such as impurity profile of a transistor etc. For example, in the case where oxidation and diffusion of impurity materials progress in a wafer having initial shapes of parts of a semiconductor device right after ion implantation of the impurity materials, it is possible to predict time dependent variation or transition of impurity profile in the device and final shape of parts of the device, by alternately solving variation of shapes due to oxidation at each oxidation/diffusion time and diffusion of the impurity material (i.e. flux) in the atmosphere for oxidation.

By optimizing transistors using the process simulator so that semiconductor devices composed of the transistors may display the best performance or electrical property, both cost and time needed for manufacturing the semiconductor devices can be considerably reduced, compared with the case in which a lot of LSIs etc. are actually manufactured on a trial basis. Furthermore, it is possible to make analyses of movement of impurity materials in semiconductor devices, since process simulators are capable of calculating internal physical quantities in semiconductor devices. In order to obtain internal physical quantities by process simulators, it is needed to solve partial differential equations such as diffusion continuity equation representing movement of impurity materials. However, it is impossible to analytically solve these kinds of partial differential equations. Therefore, in use of process simulators, a semiconductor device is divided or partitioned into a plurality of small elements, and partial differential equations are applied to these small elements discretely, As an example of a method for calculating one-dimensional impurity profile due to oxidation/diffusion, there is a document for reference by Morisue: "Designing and Manufacture Simulation of VLSI" (CMC, pages 51–62).

And as an example of a method for analyzing two-dimensional structures, there is a method in which a semiconductor device is partitioned into a plurality of small rectangular elements and partial differential equations are applied to these small rectangular elements discretely, as described in 'Process, Device, and Simulation Technique' (Sangyo Tosho, pages 90–122) by Dan.

Meanwhile, in order to execute analysis of a device having complicated shapes such as LOCOS structure or trench structure, there exists a device simulation method in which a semiconductor device is partitioned into a plurality of discrete triangular elements so that the complicated shapes of regions of the semiconductor device can be precisely realized in the simulation, as disclosed in C. S. Rafferty et al. 'Iterative Methods in Semiconductor Device Simulation' (IEEE Trans. on ED, Vol.ED-32, No. 10, October 1985, pages 2018–2027).

FIG. 1A through FIG. 1C are schematic diagrams showing an example of a simulation for a semiconductor device having trench structure which is quoted from aforementioned document of C. S. Rafferty et al. Each figure shows each process of a simulation for a CMOS which has trench isolated structure, in which FIG. 1A is showing a sectional structure of the CMOS. FIG. 1B is showing initial grid for the simulation, and FIG. 1C is showing generated working grid. By partitioning the shapes of parts of a device into small discrete elements using the triangular grid, the shapes of parts are expressed by a set of triangular elements and the shape of the trench structure can be precisely expressed.

In the following, solution for the aforementioned partial differential equations by finite difference method using the triangular grid will be briefly explained.

FIG. 2 is an enlarged schematic diagram showing part of FIG. 1B for explaining the finite difference method utilizing the triangular elements. First, concentration of an impurity material and an electric potential due to activated impurity material are defined on each lattice point of the triangular grid, i.e. on the vertexes of triangles. The impurity material diffuses according to a concentration gradient of the impurity material and an electric potential gradient (i.e. an electric field) at the point. The flux of the diffusing impurity material is defined on each side of the triangles. Here, according to theorem of Gauss, when a closed surface is defined, a volume integral of the impurity material concentration in the closed surface is equal to a surface integral of normal components of the impurity material flux all over the closed surface.

The theorem of Gauss is applied to each 'volume element' corresponding to each vertex of the triangular grid, in which each volume element has a polygonal shape and unit thickness in three-dimensional space. In order to apply the theorem of Gauss to the discrete volume element, the closed surface, i.e. the surface of the volume element, is needed to be defined perpendicular to the flux, that is , each side of the polygon has to be perpendicular to the flux. Therefore, the closed surface, i.e. the surface of the volume element, in the theorem of Gauss has to be defined so that the polygon is surrounded by perpendicular bisectors of the triangles, that is, the polygon is surrounded by sides each of which is connecting between circumcenters of the triangles. Here, each volume element which is corresponding to each vertex of the triangles is generally called 'a control volume'. In this case, the gross amount of the impurity material controlled by each vertex is equal to the concentration of the impurity material at the vertex multiplied by the volume (the area×1, in two dimensional models) of the control volume, and the sum of the gross amounts corresponding to all the vertexes in the system to be analyzed is equal to the gross dose of the impurity material in the ion implantation.

Incidentally, in order to realize appropriate control volumes (i.e. appropriate close surfaces corresponding to each vertex), there exists a necessary condition that the distance between circumcenters of adjacent triangles should not be negative, since negative cross section for integration occurs in the surface integral of the flux if the distance between circumcenters of the adjacent triangles becomes negative. If the necessary condition is not satisfied, physically impossible voltage spikes occur as shown in FIG. 3 which is quoted from aforementioned document of C. S. Rafferty et al. Further, if the necessary condition is not satisfied, overlap of more than one control volume occurs, and thus the aforementioned sum of the impurity material gross amounts corresponding to all the vertexes in the system can not keep being equal to the gross dose of the ion implantation.

For satisfying the necessary condition that the distance between circumcenters of adjacent triangles should not be negative, it is necessary to partition two-dimensional regions into the triangular elements guaranteeing 'Delaunay partitioning' which requires that no vertexes of other triangles should not exist in a circumscribed circle of a triangle. There is a known method for partitioning the region into triangular elements guaranteeing the Delaunay partitioning, as disclosed in M. S. Mock "Tetrahedral Elements and the Scharferrer-Gummel Methods" (Proceedings of the NASECODE IV, pages 36–47, 1985).

Next, in the following, a conventional calculation method for simulation of oxidation will be described.

As described in "Semiconductor Process.Device Simulation Technique" (REALIZE INC., 1990), pages 79–89, S. Isomae "Simulation of Two-Dimensional Oxidation", oxidation phenomenon can be considered to be comprised of two alternate processes: diffusion of an oxidant or an oxidizing agent in the oxide layer and variation of the shape of the oxide layer due to oxidation (for example, Si→SiO$_2$).

In calculation of time-dependent variation of shapes of regions of the semiconductor device, first, distribution of concentration of the oxidant in the oxide layer is obtained by solving the two-dimensional Laplace's differential equation (1) in the shape before deformation due to oxidization.

$$D\nabla^2 C(x, y) = 0 \quad (1)$$

Here, D: diffusion coefficient of the oxidant in the oxide layer, C(x,y): concentration of the oxidand at the position (x,y).

Subsequently, variation of the shapes is calculated. Movement distance of each vertex of the triangular grid (triangular mesh) due to oxidation is obtained by solving the following equilibrium equation (2) and constitutive equation (3), using movement distance of oxidation interface according proportionally to concentration of the oxidant on the oxidation interface obtained by the equation (1), and displacement due to inflation or swelling by oxidation, as boundary conditions.

$$\delta\sigma_{ij}/\delta x_j = 0 \quad (2)$$

$$\sigma_{ij}(t) = \varepsilon_{kl}(0)G_{ijkl}(t) + \int_o^t G_{ijkl}(t-\tau)\{\delta\varepsilon_{kl}(\tau)/\delta\tau\}d\tau \quad (3)$$

Here, $\sigma_{ij}$ (t) is an element of a stress tensor, $X_j$ is a position, $\varepsilon_{kl}$ is an element of a deformation tensor, $G_{ijkl}$ is a relaxation function, and $\delta$ is a symbol denoting partial differentiation.

Incidentally, when oxidation process is calculated and simulated in the process simulator, the shapes of the regions vary as time passes, and the shapes of the discrete triangular elements vary. Therefore, even if aforementioned Delaunay partitioning requiring that 'no vertexes of other triangles should not exist in a circumscribed circle of a triangle' is satisfied at the moment before oxidation, the Delaunay partitioning begins to be unguaranteed as the shapes of the discrete triangular elements vary due to deformation by oxidation.

Thus, when a diffusion equation for obtaining diffusion of the impurity material is solved subsequently to oxidation (deformation) calculation, another triangular partitioning guaranteeing the Delaunay partitioning has to be executed to the shapes of the regions after deformation. Further, even in the case where another triangular partitioning guaranteeing the Delaunay partitioning is executed to the shapes of the regions after deformation, control volumes alsovary according to the reconstruction of the triangular elements.

Therefore, in order to keep on guaranteeing the Delaunay partitioning and keep on conserving the gross dose of the impurity material introduced in ion implantation etc., a process simulation method for properly distributing the impurity material as described below is proposed by the present inventor in Japanese Patent Laid-Open Publication No. 9-17738(1997).

Briefly, the method comprises the following steps in order to conserve the gross dose of the impurity material.

(1) Control volumes which has been defined before oxidation are deformed according to variation of shapes due to oxidation obtained by oxidation calculation (post-deformation control volumes).

(2) Another triangular partitioning guaranteeing the Delaunay partitioning is executed to the shapes after deformation.

(3) Control volumes are redefined for the new triangular grid (mesh) (new control volumes).

(4) By executing AND operation between the post-deformation control volumes and the new control volumes, impurity material in the post-deformation control volumes is fully handed over to the new control volumes with no loss.

FIG. 4 is a flow chart showing the steps involved in the process simulation method presently proposed by the present inventor.

First, triangular mesh (grid) for the initial shapes of regions of a semiconductor device to be simulated is generated by the process simulator, guaranteeing Delaunay partitioning. Partitioning guaranteeing Delaunay partitioning is executed according to a similar method to the method elaborated in the aforementioned document "Tetrahedral Elements and the Scharferrer-Gummel Method" (pre-deformation triangular mesh) (step S1).

Subsequently, control volumes for the pre-deformation triangular mesh are defined by the process simulator. In other words, the process simulator defines aforementioned each 'volume element' corresponding to each vertex of the triangular grid as a control volume for the vertex of the pre-deformation triangular mesh. Incidentally, the surface of the 'volume element' (i.e. the polygon) is surrounded by sides each of which is connecting between circumcenters of the triangles (pre-deformation control volumes) (step S2).

Subsequently, in the initial shapes of regions of the semiconductor device, impurity material concentrations due to introduction by ion implantation etc. are set by the process simulator on each vertex of the pre-deformation triangular mesh (step S3).

Subsequently, unit time Δt for oxidation (deformation) and diffusion is added to the time counted by the process simulator (step S4).

Subsequently, oxidation calculation is executed and deformation of the triangular mesh according to the oxidation calculation is executed by the process simulator. In other words, deformation of the pre-deformation triangular mesh due to oxidation is calculated and positions of each vertex of the pre-deformation triangular mesh are displaced (post-deformation triangular mesh) (step S5).

Subsequently, the control volumes corresponding to each vertex of the triangular mesh are deformed by the process simulator according to the deformation of the triangular mesh (post-deformation control volumes) (step S6).

Subsequently, volume ratios of the post-deformation control volumes to the pre-deformation control volumes are obtained by the process simulator and impurity material concentrations are set by the process simulator on each vertex of the post-deformation triangular mesh according to the obtained volume ratio and impurity material concentrations on each vertex of the pre-deformation triangular mesh. Here, impurity material concentration on a vertex on the post-deformation triangular mesh is set equal to impurity material concentration on the vertex on the pre-deformation triangular mesh multiplied by the obtained volume ratio, and thus impurity material concentrations on each vertex get lower according to control volumes which are swelling due to oxidation (step S7).

Subsequently, after the setting of impurity material concentrations after deformation, another triangular mesh for deformed shapes of regions of the semiconductor device is newly generated by the process simulator, guaranteeing the Delaunay partitioning (new triangular mesh) (step S8).

Subsequently, another control volumes corresponding to each vertex are defined for the new triangular mesh by the process simulator (new control volumes) (step S9).

Subsequently, the amount of the impurity material in the post-deformation control volumes is fully transferred to the new control volumes by the process simulator by executing AND operation between the post-deformation control volumes and the new control volumes (step S10).

Subsequently, diffusion calculation is executed by the process simulator using the new control volumes and the concentrations of the impurity material on vertexes of the new triangular mesh, i.e. diffusion equation of the impurity material is solved (step S11).

Subsequently, it is judged whether or not predetermined time has been counted. If NO, process is returned to the step S4 to repeat the step S4 through the step S11 until the predetermined time is counted by the process simulator. If YES, the process simulation is ended (step S12).

FIG. 5 is a flow chart showing the process of the step S10 of FIG. 4 in which the amount of the impurity material in the post-deformation control volumes is fully transferred to the new control volumes by executing AND operation. In the following, the steps involved in the process of the step S10 will be described.

First, a new control volume ICVnew is arbitrarily chosen (step S21). Subsequently, a post-deformation control volume ICVold corresponding to the chosen new control volume ICVnew is chosen (step S22).

Subsequently, AND operation is executed between the ICVnew and the ICVold, and the area $S_{AND}$ of the overlap between ICVnew and the ICVold is obtained (step S23). Subsequently, the amount of the impurity material $D_{AND}$ in the overlap is obtained by multiplying the $S_{AND}$ and the impurity material concentration set on the post-deformation triangular mesh in the step S7 of FIG. 4 (step S24). Subsequently, obtained $D_{AND}$ is added to the amount of impurity material Dnew in the new control volume ICVnew (step S25).

Subsequently, it is judged whether or not the step S23 through the step S25 has been executed to all of post-deformation control volumes overlapping with the new control volume (step S26). If NO, next post-deformation control volumes overlapping with the new control volume is chosen, and process is returned to the step S23 in order to repeat the step S23 through the step S25 (step S29). If YES, impurity material concentration on a vertex corresponding to the new control volume ICVnew is obtained by dividing the resultant Dnew by the area of the new control volume ICVnew (step S27).

Subsequently, it is judged whether or not the aforementioned process has been executed to all of new control volumes (step S28). If NO, next new control volume ICVnew is chosen, and process is returned to the step S22 in order to repeat the step S22 through the step S29 (step S30).

As described above, according to the process simulation method presently proposed by the present inventor, the pre-deformation control volumes corresponding to the pre-deformation triangular mesh is deformed to the post-deformation control volumes corresponding to the post-deformation triangular mesh according to deformation of the triangular mesh obtained in the oxidation calculation, impurity material concentrations on vertexes of the post-deformation triangular mesh are properly set according to impurity material concentrations on vertexes of the pre-deformation triangular mesh and the obtained volume ratio due to deformation, the new triangular mesh is generated guaranteeing Delaunay partitioning and the new control volumes are defined for deformed shapes of regions of the semiconductor device, and the diffusion calculation is executed after the amount of the impurity material in the post-deformation control volumes is fully and properly transferred to the new control volumes by executing AND operation between post-deformation control volumes and new control volumes.

Therefore, by the process simulation method presently proposed by the present inventor, process simulation keeping on guaranteeing the Delaunay partitioning and keeping conservation of the gross dose of the impurity material due to introduction such as ion implantation is realized, even in the case where shapes of regions of the semiconductor device vary as time passes due to oxidation.

However, the aforementioned method proposed by the present inventor has a drawback to need considerable calculation time, since the same triangular mesh is used for both oxidation calculation and diffusion calculation, and thus fine mesh is needed both in the silicon oxide layer and in the silicon layer in order to execute calculation with high precision.

For both high precision calculation and short calculation time, the triangular mesh for oxidation calculation is needed to be fine in and around the silicon oxide layer and coarse in the silicon layer. On the other hand, the triangular mesh for diffusion calculation is needed to be finer in the silicon layer and coarser in the silicon oxide layer compared to the triangular mesh for oxidation calculation. However, in the aforementioned proposed method, triangular mesh after diffusion calculation is utilized as triangular mesh for the next oxidation calculation, and alteration of density of the triangular mesh is impossible.

It is of course possible to generate triangular mesh for oxidation calculation after diffusion calculation. However, it is necessary to transfer and properly distribute the impurity material from the triangular mesh for diffusion calculation into the triangular mesh for oxidation calculation. In this case, when the impurity material is distributed from the triangular mesh for diffusion calculation in which the silicon layer has fine mesh into the triangular mesh for oxidation calculation in which the silicon layer has coarse mesh, detailed information of impurity profile in the silicon layer is lost.

SUMMARY OF THE INVENTION

It is therefore the primary object of the present invention to provide a process simulation method by which process simulation keeping on guaranteeing the Delaunay partitioning and keeping on conserving the gross dose of the impurity material due to introduction such as ion implantation is realized even in the case where shapes of regions of the semiconductor device vary as time passes due to oxidation, with both high precision calculation and short calculation time.

In accordance with the present invention, there is provided a process simulation method comprising the following eleven steps. In the first step, pre-deformation diffusion calculation triangular mesh is generated for initial shapes of regions of a semiconductor device guaranteeing Delaunay partitioning. In the second step, pre-deformation diffusion calculation control volumes are defined for the pre-deformation diffusion calculation triangular mesh. In the third step, impurity material concentrations due to introduction by ion implantation etc. are set on each vertex of the pre-deformation diffusion calculation triangular mesh in the initial shapes of regions of the semiconductor device.

In the fourth step, oxidation calculation triangular mesh is generated for the shapes of regions of the semiconductor device before oxidation. In the fifth step, oxidation calculation is executed and the oxidation calculation triangular mesh is deformed according to the oxidation calculation. In the sixth step, pre-deformation diffusion calculation triangular mesh and pre-deformation diffusion calculation control volumes are deformed to post-deformation diffusion calculation triangular mesh and post-deformation diffusion calculation control volumes respectively according to the deformation of the oxidation calculation triangular mesh in the fifth step. In the seventh step, impurity material concentrations on each vertex of the post-deformation diffusion calculation triangular mesh are set according to impurity material concentrations on each vertex of the pre-deformation diffusion calculation triangular mesh and volume ratio of the post-deformation diffusion calculation control volume to the pre-deformation diffusion calculation control volume. In the eighth step, new diffusion calculation triangular mesh is generated for deformed shapes of regions of the semiconductor device guaranteeing Delaunay partitioning. In the ninth step, new diffusion calculation control volumes are defined for the new diffusion calculation triangular mesh. In the tenth step, the amount of the impurity material in the post-deformation diffusion calculation control volumes is fully transferred to the new diffusion calculation control volumes by executing AND operation between the post-deformation diffusion calculation control volumes and the new diffusion calculation control volumes. And in the eleventh step, diffusion calculation is executed using the new diffusion calculation control volumes and the concentrations of the impurity material on vertexes of the new diffusion calculation triangular mesh. The process between the fourth step and the eleventh step for unit time$\Delta t$ is repeated until predetermined time is counted by the process simulator.

Preferably, the sixth step mentioned above includes the following eight steps. In the first step, a position $P_{diff}$ of a vertex or a circumcenter of a triangle composing the pre-deformation diffusion calculation triangular mesh is arbitrarily chosen. In the second step, a triangle $T_{ox}$ composing the oxidation calculation triangular mesh before deformation is chosen. In the third step, it is judged whether or not the chosen triangle $L_{ox}$ includes the chosen position $P_{diff}$. In the fourth step, if the judgment in the third step is NO, next triangle $T_{ox}$ composing the oxidation calculation triangular mesh before deformation is chosen and process is returned to the third step. In the fifth step, if the judgment in the third step is YES, the position $P_{diff}$ is moved using movement of three vertexes of the triangle $T_{ox}$ of the oxidation calculation triangular mesh by deformation due to oxidation. In the sixth step, it is judged whether or not all of the vertexes and the circumcenters of the pre-deformation diffusion calculation triangular mesh have been moved. In the seventh step, if the judgment in the sixth step is NO, next position $P_{diff}$ of a vertex or a circumcenter of a triangle composing the pre-deformation diffusion calculation triangular mesh is chosen and process is returned to the second step. And in the eight step, if the judgment in the sixth step is YES, post-deformation diffusion calculation control volumes are defined for the resultant post-deformation diffusion calculation triangular mesh.

Preferably, in the fifth step mentioned above, in the case where positions of the three vertexes of the triangle $T_{ox}$ in the oxidation calculation triangular mesh:

$$P_{OX}1(X1_{OX}, Y1_{OX}), P_{OX}2(X2_{OX}, Y2_{OX}), P_{OX}3(X3_{OX}, Y3_{OX})$$

moved into $$(X1_{OX}^{move}, Y1_{OX}^{move}), (X2_{OX}^{move}, Y2_{OX}^{move}), (X3_{OX}^{move}, Y3_{OX}^{move})$$

by deformation due to oxidation, the position $P_{diff}$ of the vertex or the circumcenter in the diffusion calculation triangular mesh: $P_{diff}(X_{diff}, Y_{diff})$ is moved into $P_{diff}^{move}(X_{diff}^{move}, Y_{diff}^{move})$ as the following equations.

$$X_{diff}^{move} = X1_{OX}^{move} + (X2_{OX}^{move} - X1_{OX}^{move})S + (X3_{OX}^{move} - X2_{OX}^{move})ST$$

$$Y_{diff}^{move} = Y1_{OX}^{move} + (Y2_{OX}^{move} - Y1_{OX}^{move})S + (Y3_{OX}^{move} - Y2_{OX}^{move})ST$$

Here, $$S = \{(X_{diff} - X1_{OX})(Y3_{OX} - Y2_{OX}) - (X3_{OX} - X2_{OX})(Y_{diff} - Y1_{OX})\} / \{(X2_{OX} - X1_{OX})(Y3_{OX} - Y2_{OX}) - (X3_{OX} - X2_{OX})(Y2_{OX} - Y1_{OX})\}$$

$$T = \{(X2_{OX} - X1_{OX})(Y_{diff} - Y1_{OX}) - (X_{diff} - X1_{OX})(Y2_{OX} - Y1_{OX})\} / \{(X_{diff} - X1_{OX})(Y3_{OX} - Y2_{OX}) - (X3_{OX} - X2_{OX})(Y_{diff} - Y1_{OX})\}.$$

Preferably, the aforementioned tenth step includes the following eleven steps. In the first step, a new diffusion calculation control volume is chosen. In the second step, a post-deformation diffusion calculation control volume corresponding to the chosen new diffusion calculation control volume is chosen. In the third step, AND operation is executed between the chosen new diffusion calculation control volume and the chosen post-deformation diffusion calculation control volume, and the area $S_{AND}$ of the overlap between the two control volumes is obtained. In the fourth step, the amount $D_{AND}$ of the impurity material in the overlap is obtained by multiplying the $S_{AND}$ and the impurity material concentration set on the post-deformation diffusion calculation triangular mesh. In the fifth step, obtained $D_{AND}$ is added to the amount of the impurity material in the new diffusion calculation control volume. In the sixth step, it is judged whether or not the third step through the fifth step have been executed to all post-deformation diffusion calculation control volumes overlapping with the new diffusion calculation control volume. In the seventh step, if the judgment in the sixth step is NO, next post-deformation diffusion calculation control volume overlapping with the new diffusion calculation control volume is chosen and process is returned to the third step. In the eighth step, if the judgment in the sixth step is YES, impurity material concentration on a vertex corresponding to the new diffusion calculation control volume is obtained by dividing the resultant amount of the impurity material in the new diffusion calculation control volume by the area of the new control volume. In the ninth step, it is judged whether or not the second step through the eighth step have been executed to all new diffusion calculation control volumes. In the tenth step, if the judgment in the ninth step is NO, next new diffusion calculation control volume is chosen and process is returned to the second step. And in the eleventh step, if the judgment in the ninth step is YES, the process for the aforementioned tenth step is finished.

In accordance with another aspect of the present invention, there is provided a process simulation method comprising the following twelve steps. In the first step, pre-deformation diffusion calculation triangular mesh is generated for initial shapes of regions of a semiconductor device guaranteeing Delaunay partitioning. In the second step, pre-deformation diffusion calculation control volumes are defined for the pre-deformation diffusion calculation triangular mesh. In the third step, impurity material concentrations due to introduction by ion implantation etc. are set on each vertex of the pre-deformation diffusion calculation triangular mesh in the initial shapes of regions of the semiconductor device. In the fourth step, vertexes of the oxidation calculation triangular mesh are added to points where stress gradient is large. In the fifth step, oxidation calculation triangular mesh for the shapes of regions of the semiconductor device before oxidation is generated using the vertexes which has been added in the fourth step. In the sixth step, oxidation calculation is executed and the oxidation calculation triangular mesh is deformed according to the oxidation calculation. In the seventh step, pre-deformation diffusion calculation triangular mesh and pre-deformation diffusion calculation control volumes are deformed to post-deformation diffusion calculation triangular mesh and post-deformation diffusion calculation control volumes respectively according to the deformation of the oxidation calculation triangular mesh in the sixth step. In the eighth step, impurity material concentrations on each vertex of the post-deformation diffusion calculation triangular mesh are set according to impurity material concentrations on each vertex of the pre-deformation diffusion calculation triangular mesh and volume ratio of the post-deformation diffusion calculation control volume to the pre-deformation diffusion calculation control volume. In the ninth step, new diffusion calculation triangular mesh is generated for deformed shapes of regions of the semiconductor device guaranteeing Delaunay partitioning. In the tenth step, new diffusion calculation control volumes are defined for the new diffusion calculation triangular mesh. In the eleventh step, the amount of the impurity material in the post-deformation diffusion calculation control volumes is fully transferred to the new diffusion calculation control volumes by executing AND operation between the post-deformation diffusion calculation control volumes and the new diffusion calculation control volumes. And in the twelfth step, diffusion calculation is executed using the new diffusion calculation control volumes and the concentrations of the impurity material on vertexes of the new diffusion calculation triangular mesh. The process between the fourth step and the twelfth step for unit timeΔt is repeated until predetermined time is counted by the process simulator.

Preferably, each of the vertexes added in the step fourth step is added to a midpoint of adjacent two vertexes of the oxidation calculation triangular mesh if the stress ratio between the adjacent two vertexes is larger than a predetermined value.

Preferably, the predetermined value is two.

In accordance with another aspect of the present invention, there is provided a process simulation method comprising the following twelve steps. In the first step, pre-deformation diffusion calculation triangular mesh is generated for initial shapes of regions of a semiconductor device guaranteeing Delaunay partitioning. In the second step, pre-deformation diffusion calculation control volumes are defined for the pre-deformation diffusion calculation triangular mesh. In the third step, impurity material concentrations due to introduction by ion implantation etc. are set on each vertex of the pre-deformation diffusion calculation triangular mesh in the initial shapes of regions of the semiconductor device. In the fourth step, oxidation calculation triangular mesh is generated for the shapes of regions of the semiconductor device before oxidation. In the fifth step, oxidation calculation is executed and the oxidation calculation triangular mesh is deformed according to the oxidation calculation. In the sixth step, pre-deformation diffusion calculation triangular mesh and pre-deformation diffusion calculation control volumes are deformed to post-deformation diffusion calculation triangular mesh and post-deformation diffusion calculation control volumes respectively according to the deformation of the oxidation calculation triangular mesh in the fifth step. In the seventh step, impurity material concentrations on each vertex of the post-deformation diffusion calculation triangular mesh are set according to impurity material concentrations on each vertex of the pre-deformation diffusion calculation triangular mesh and volume ratio of the post-deformation diffusion calculation control volume to the pre-deformation diffusion calculation control volume. In the eighth step, vertexes of the diffusion calculation triangular mesh are added to points where concentration gradient of the impurity material is large. In the ninth step, new diffusion calculation triangular mesh for deformed shapes of regions of the semiconductor device is generated using the vertexes which has been added in the eighth step guaranteeing Delaunay partitioning. In the tenth step, new diffusion calculation control volumes are defined for the new diffusion calculation triangular mesh. In the eleventh step, the amount of the impurity material in the post-deformation diffusion calculation control volumes is fully transferred to the new diffusion calculation control volumes by executing AND operation between the post-deformation diffusion calculation control volumes and the new diffusion calculation control volumes. And in the twelfth step, diffusion calculation is executed using the new diffusion calculation control volumes and the concentrations of the impurity material on vertexes of the new diffusion calculation triangular mesh. The process between the fourth step and the twelfth step for unit timeΔt is repeated until predetermined time is counted by the process simulator.

Preferably, each of the vertexes added in the eighth step is added to a midpoint of adjacent two vertexes of the diffusion calculation triangular mesh if the concentration ratio of the impurity material between the adjacent two vertexes is larger than a predetermined value.

Preferably, the predetermined value is ten.

In accordance with another aspect of the present invention, there is provided a process simulation method using oxidation calculation triangular mesh for simulating deformation of regions of a semiconductor device due to oxidation, diffusion calculation triangular mesh for simulating diffusion of impurity materials introduced by ion implantation etc. in the semiconductor device, and diffusion calculation control volumes defined to each vertex of the diffusion calculation triangular mesh, comprising the following eight steps. In the first step, the diffusion calculation triangular mesh is generated for shapes of regions of the semiconductor device before deformation due to oxidation guaranteeing Delaunay partitioning, the oxidation calculation triangular mesh is generated for the shapes before deformation due to oxidation, and the diffusion calculation control volumes are defined to each vertex of the diffusion calculation triangular mesh. In the second step, impurity material concentrations are set on each vertex of the diffusion calculation triangular mesh in the initial shapes of regions of the semiconductor device. In the third step, oxidation calculation is executed and the oxidation calculation triangular mesh is deformed according to the oxidation calculation. In the fourth step, the diffusion calculation triangular mesh and the diffusion calculation control volumes are deformed according to the deformation of the oxidation calculation triangular mesh in the third step. In the fifth step, the impurity material concentrations on each vertex of the diffusion calculation triangular mesh are altered according to volume ratio of the diffusion calculation control volume after deformation to the diffusion calculation control volume before deformation. In the sixth step, new diffusion calculation triangular mesh and corresponding new diffusion calculation control volumes are defined for deformed shapes of regions of the semiconductor device guaranteeing Delaunay partitioning. In the seventh step, the amount of the impurity material in the diffusion calculation control volumes after deformation is fully transferred to the new diffusion calculation control volumes by executing AND operation between the diffusion calculation control volumes after deformation and the new diffusion calculation control volumes. And in the eighth step, diffusion calculation is executed using the new diffusion calculation control volumes and the concentrations of the impurity material on vertexes of the new diffusion calculation triangular mesh. The process between the third step and the eighth step for unit time $\Delta t$ is repeated until predetermined time is counted by the process simulator.

BRIEF DESCRIPTION OF THE DRAWINGS

The objects and features of the present invention will become more apparent from the consideration of the following detailed description taken in conjunction with the accompanying drawings, in which:

FIG. 8 is a flow chart showing process of defining post-deformation diffusion calculation control volumes in step S37 of FIG. 6;

FIG. 9 is a flow chart showing process of step S41 of FIG. 6 in which the amount of an impurity material in post-deformation diffusion calculation control volumes is fully transferred to new diffusion calculation control volumes by executing AND operation;

DESCRIPTION OF THE PREFERRED EMBODIMENTS

Figure 1A:
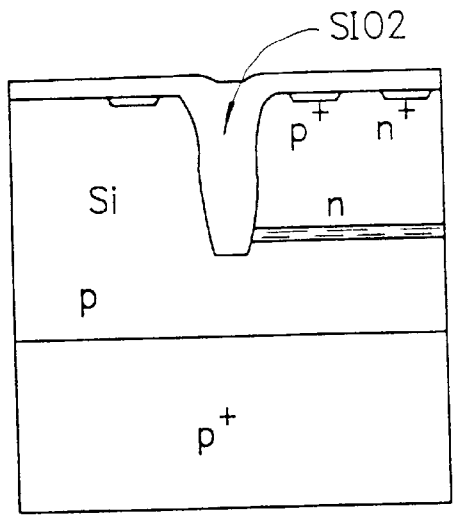
FIG. 1A through FIG. 1C are schematic diagrams showing an example of a simulation for a semiconductor device having trench structure.
Figure 1B:
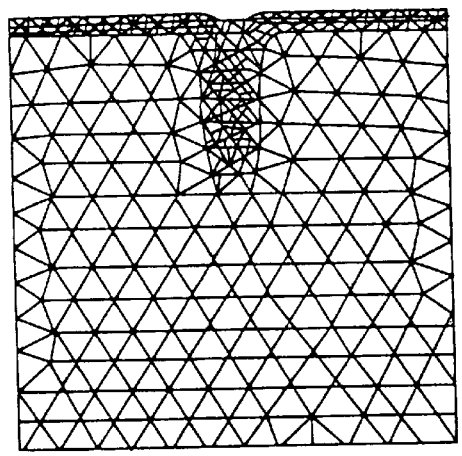
Figure 1C:
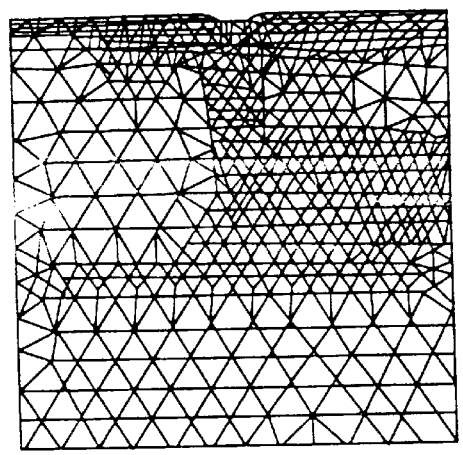
Figure 2:
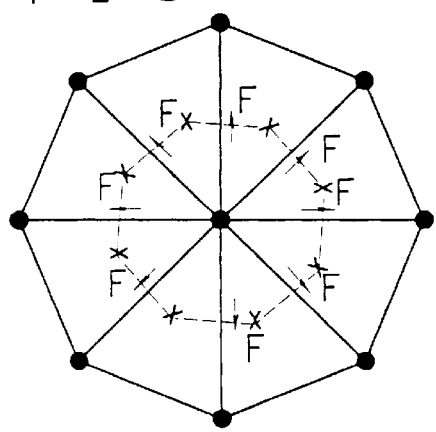
FIG. 2 is an enlarged schematic diagram showing part of FIG. 1B for explaining the finite difference method utilizing the triangular elements.
Figure 3:
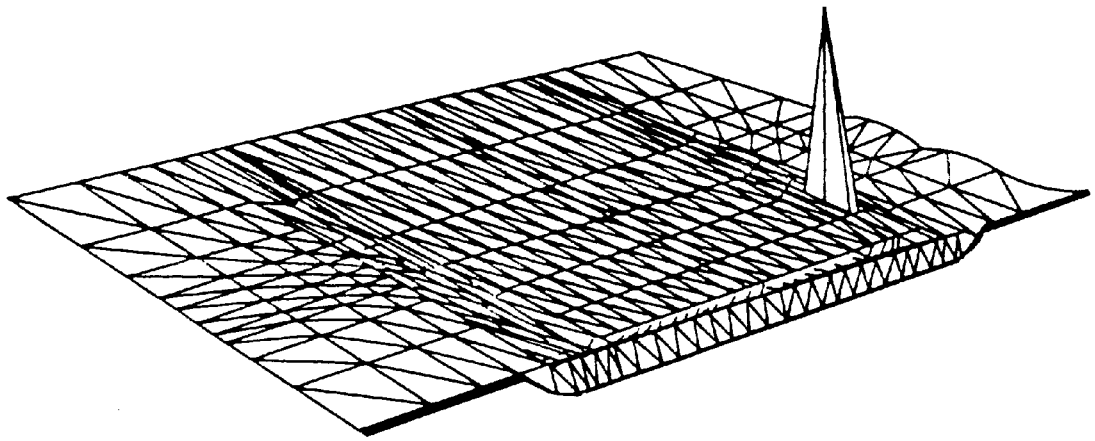
FIG. 3 is a schematic diagram showing an example of a voltage spike which occurs when a necessary condition is not satisfied.
Figure 4:
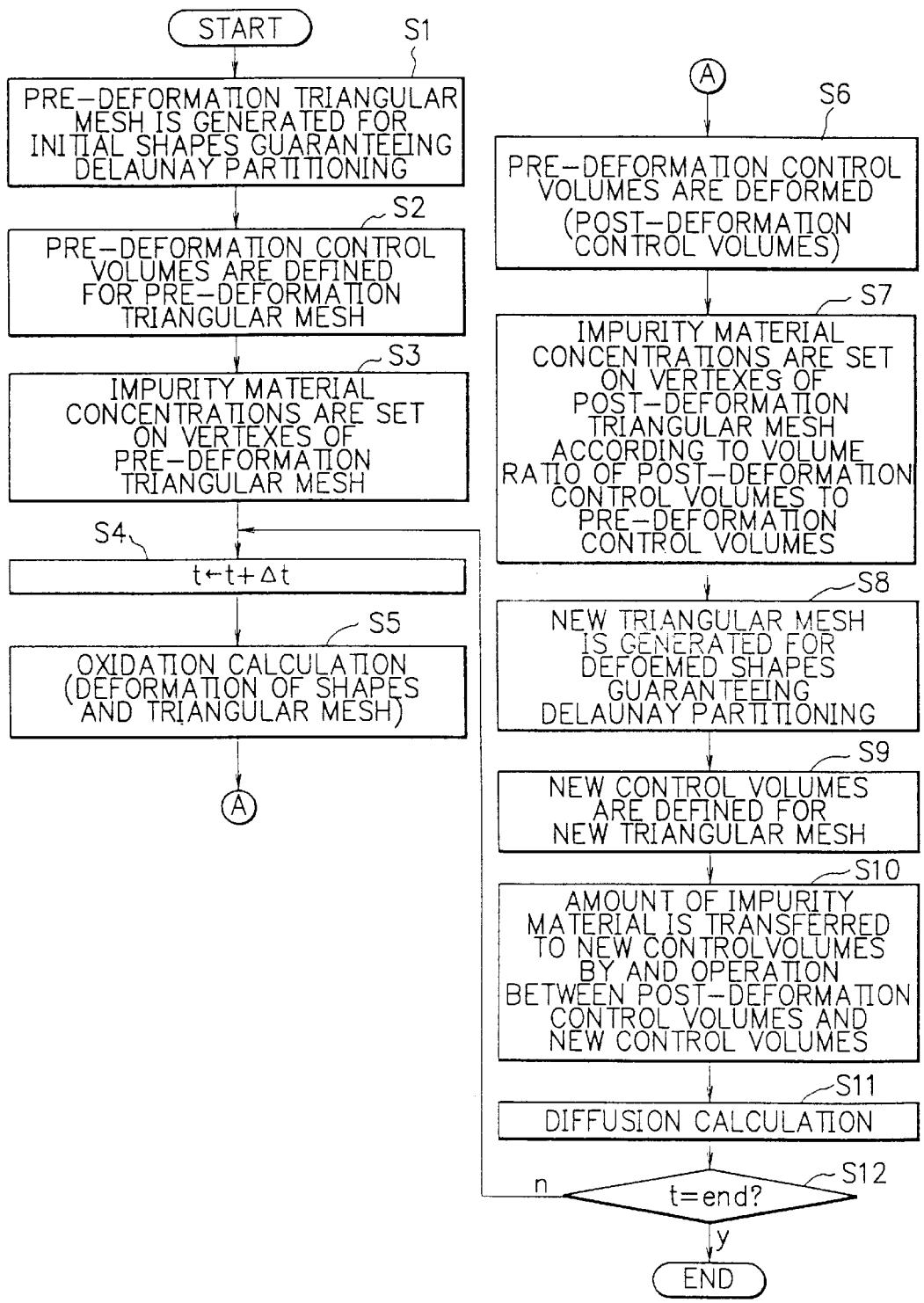
FIG. 4 is a flow chart showing the steps involved in the process simulation method presently proposed by the present inventor.
Figure 5:
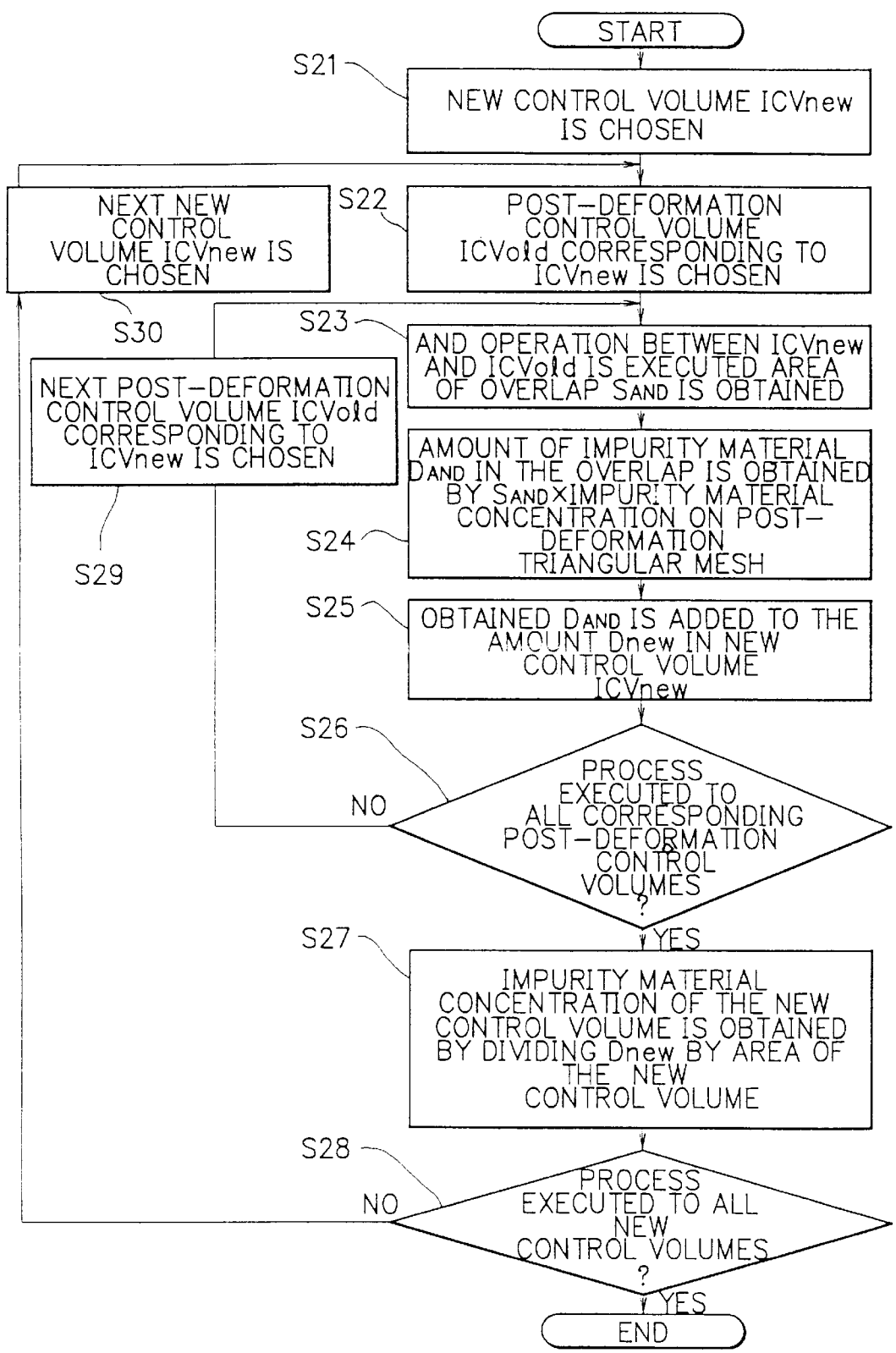
FIG. 5 is a flow chart showing process of step S10 of FIG. 4 in which the amount of an impurity material in post-deformation control volumes is fully transferred to new control volumes by executing AND operation.

Referring now to the drawings, a description will be given in detail of preferred embodiments in accordance with the present invention.

Figure 6:
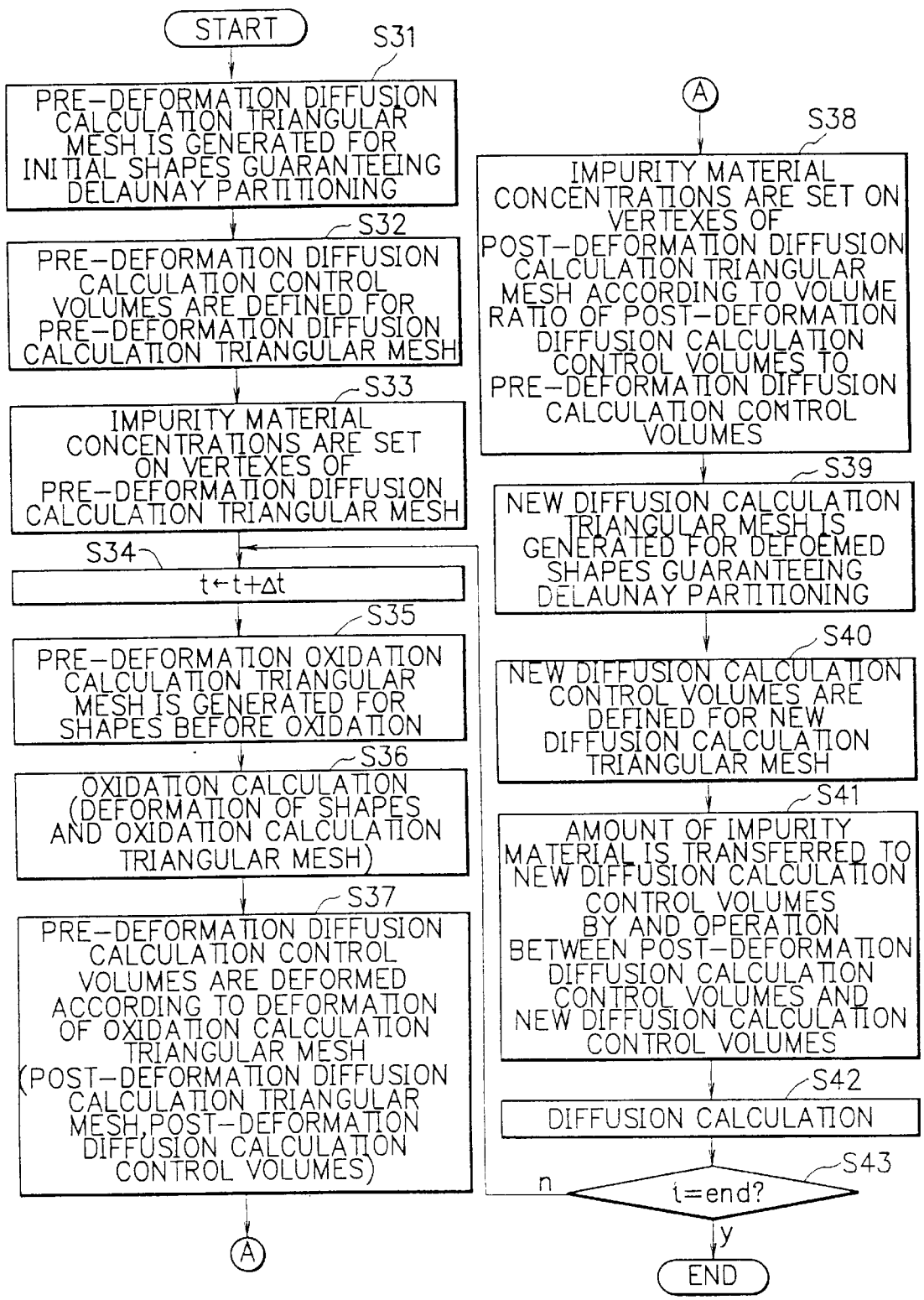
FIG. 6 is a flow chart showing the steps in the process simulation method according to an embodiment of the present invention.

FIG. 6 is a flow chart showing the steps in the process simulation method according to an embodiment of the present invention. FIG. 7A through FIG. 7E are schematic diagrams showing variation of triangular mesh according to the embodiment. The process simulation method shown in FIG. 6 is executed by a process simulator realized by a computer system including a CPU, a storage means (ROM, RAM, HDD), a software for process simulation, etc.

First, triangular mesh for diffusion calculation is generated by the process simulator for initial shapes of regions of a semiconductor device. guaranteeing Delaunay partitioning. Partitioning guaranteeing Delaunay partitioning is executed according to a similar method to the method elaborated in the aforementioned document "Tetrahedral Elements and the Scharferrer-Gummel Method" and is not elaborated here (pre-deformation diffusion calculation triangular mesh) (step S31).

Figure 7A:
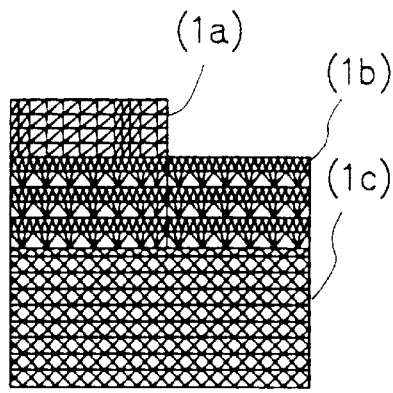
FIG. 7A through FIG. 7E are schematic diagrams showing variation of triangular mesh according to an embodiment of the present invention.

FIG. 7A shows the triangular mesh for diffusion calculation generated for the initial shapes before oxidation, in which (1a) denotes a silicon nitride layer, (1b) denotes a silicon oxide layer, and (1c) denotes a silicon layer. In the mesh for diffusion calculation, relatively fine mesh is defined in the silicon layer.

Subsequently, control volumes for the pre-deformation diffusion calculation triangular mesh are defined by the process simulator. In other words, the process simulator defines aforementioned each 'volume element' corresponding to each vertex of the triangular grid as a control volume for the vertex of the pre-deformation diffusion calculation triangular mesh. Incidentally, the surface of the 'volume element' (i.e. the polygon) is surrounded by sides each of which is connecting between circumcenters of the triangles (pre-deformation diffusion calculation control volumes) (step S32).

Subsequently, in the initial shapes of regions of the semiconductor device, impurity material concentrations due to introduction by ion implantation etc. are set by the process simulator on each vertex of the pre-deformation diffusion calculation triangular mesh (step S33).

Subsequently, unit time $\Delta t$ for oxidation (deformation) and diffusion is added to the time counted by the process simulator (step S34).

Subsequently, triangular mesh for oxidation calculation is generated by the process simulator for the shapes of regions before oxidation, guaranteeing Delaunay partitioning (pre-deformation oxidation calculation triangular mesh). Incidentally, control volumes are defined for diffusion calculation only, and definition of control volumes corresponding to the pre-deformation oxidation calculation triangular mesh is not executed by the process simulator (step S35).

Figure 7B:
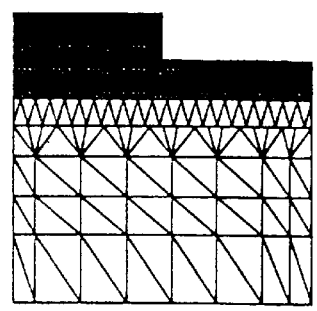

FIG. 7B shows the triangular mesh for oxidation calculation generated for the initial shapes before oxidation.

In the mesh for oxidation calculation, fine mesh is defined in the silicon oxide layer and the silicon nitride layer in which deformation due to oxidation occurs.

Subsequently, oxidation calculation is executed and deformation of the oxidation calculation triangular mesh according to the oxidation calculation is executed by the process simulator. In other words, deformation of the pre-deformation oxidation calculation triangular mesh due to oxidation is calculated and positions of each vertex of the pre-deformation oxidation calculation triangular mesh are displaced (post-deformation oxidation calculation triangular mesh) (step S36).

Oxidation calculation in the step S36 can be executed as described in the description of the prior art according to the method elaborated in the aforementioned document "Semiconductor Process. Device Simulation Technique" (REALIZE INC., 1990), pages 79–89, S. Isomae "Simulation of Two-Dimensional Oxidation". As mentioned above, oxidation phenomenon can be treated as two alternate processes: diffusion of an oxidant in the oxide layer and variation of the shape of the oxide layer due to oxidation. By solving Laplace's differential equation (1) describing diffusion of the oxidant in oxide ($SiO_2$) layer during unit time $\Delta t$, concentration of the oxidant on the oxidation interface ($SiO_2$/Si interface) is obtained.

$$D\nabla^2 C(x, y) = 0 \qquad (1)$$

Here, D: diffusion coefficient of the oxidant in the oxide layer, C(x,y): concentration of the oxidant at the position (x,y).

Deformation of the oxide layer is obtained by solving the equilibrium equation (2) and the constitutive equation (3), using movement distance of oxidation interface according proportionally to the concentration of the oxidant on the oxidation interface obtained by the equation (1), and displacement due to inflation or swelling by oxidation, as boundary conditions.

$$\delta \sigma_{ij} / \delta x_j = 0 \qquad (2)$$

$$\sigma_{ij}(t) = \varepsilon_{kl}(0) G_{ijkl}(t) + \int_o^t G_{ijkl}(t-\tau)\{\delta \varepsilon_{kl}(\tau)/\delta \tau\} d\tau \qquad (3)$$

Here, $\sigma_{ij}(t)$: an element of a stress tensor, $x_j$: a position, $\varepsilon_{kl}$: an element of a deformation tensor, $G_{ijkl}$: a relaxation function, and $\delta$: a symbol denoting partial differentiation.

Figure 7C:
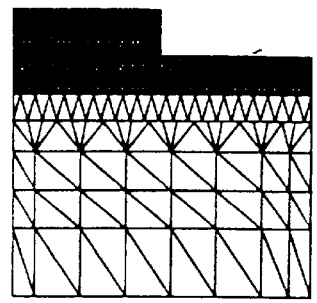

FIG. 7C shows the post-deformation oxidation calculation triangular mesh and deformed shapes of regions of the semiconductor device.

Subsequently, the pre-deformation diffusion calculation control volumes corresponding to each vertex of the pre-deformation diffusion calculation triangular mesh are deformed according to the deformation of the oxidation calculation triangular mesh (post-deformation diffusion calculation control volumes). In other words, each vertexes on the pre-deformation diffusion calculation triangular mesh are moved according to the deformation of the oxidation calculation triangular mesh to form post-deformation diffusion calculation triangular mesh, and then the post-deformation diffusion calculation control volumes are defined for each vertexes of the post-deformation diffusion calculation triangular mesh (step S37).

Figure 7D:
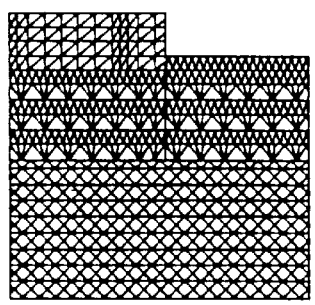

FIG. 7D shows the post-deformation diffusion calculation triangular mesh in which positions of vertexes are moved according to the deformation of the oxidation calculation triangular mesh. Here, the Delaunay partitioning is not guaranteed in the post-deformation diffusion calculation triangular mesh since the mesh has been deformed.

Subsequently, volume ratios of the post-deformation diffusion calculation control volumes to the pre-deformation diffusion calculation control volumes are obtained by the process simulator and impurity material concentrations are set on each vertex of the post-deformation diffusion calculation triangular mesh according to the obtained volume ratio and impurity material concentrations on each vertex of the pre-deformation diffusion calculation triangular mesh. Here, impurity material concentration on a vertex on the post-deformation diffusion calculation triangular mesh is set equal to impurity material concentration on the vertex on the pre-deformation diffusion calculation triangular mesh multiplied by the obtained volume ratio (step S38).

Subsequently, after the setting of impurity material concentrations after deformation, another diffusion calculation triangular mesh for deformed shapes of regions of the semiconductor device is newly generated by the process simulator, guaranteeing the Delaunay partitioning (new diffusion calculation triangular mesh) (step S39).

Incidentally, in order to generate the new diffusion calculation triangular mesh in the step 39, it is possible to use the same vertexes as those of the post-deformation diffusion calculation triangular mesh and alter the triangular elements only, to guarantee the Delaunay partitioning requiring that no vertexes of other triangles should not exist in a circumscribed circle of a triangle. However, of course it is as well possible to use new vertexes to generate the new diffusion calculation triangular mesh.

Figure 7E:
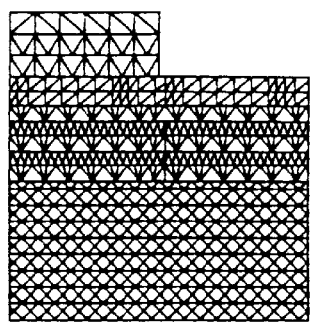

FIG. 7E shows the new diffusion calculation triangular mesh generated for the deformed shapes of regions of the semiconductor device, in which fine mesh is defined in the silicon layer.

Subsequently, another control volumes corresponding to each vertex are defined for the new diffusion calculation triangular mesh by the process simulator (new diffusion calculation control volumes) (step S40).

Subsequently, the amount of the impurity material in the post-deformation diffusion calculation control volumes is fully transferred to the new diffusion calculation control volumes by the process simulator by executing AND operation between the post-deformation diffusion calculation control volumes and the new diffusion calculation control volumes (step S41).

Subsequently, diffusion calculation is executed by the process simulator using the new diffusion calculation control volumes and the concentrations of the impurity material on vertexes of the new diffusion calculation triangular mesh, i.e. diffusion equation of the impurity material is solved (step S42).

Subsequently, it is judged whether or not predetermined time has been counted. If NO, process is returned to the step S34 to repeat the step S34 through the step S42 until the predetermined time is counted by the process simulator. Incidentally, in the next loop after the process is returned to the step S34, the new diffusion calculation triangular mesh in the previous loop is used as pre-deformation diffusion calculation triangular mesh in the step S37 of the next loop. If YES, the process simulation is ended (step S43).

FIG. 8 is a flow chart showing the process of defining the post-deformation diffusion calculation control volumes in the step S37 of FIG. 6. In the following, the steps involved in the process of the step S37 will be described.

First, a position $P_{diff}$ of a vertex or a circumcenter of a triangle composing the pre-deformation diffusion calculation triangular mesh is arbitrarily chosen (step S51).

Subsequently, a triangle $T_{ox}$ composing the pre-deformation oxidation calculation triangular mesh is arbitrarily chosen (step S52).

Subsequently, it is judged whether or not the chosen triangle $L_{ox}$ includes the chosen position $P_{diff}$ (step S53). If NO, next triangle $T_{ox}$ composing the pre-deformation oxidation calculation triangular mesh is arbitrarily chosen and process is returned to the step S53 (step S54). If YES, the position $P_{diff}$ is moved using movement of three vertexes of the triangle $T_{ox}$ of the pre-deformation oxidation calculation triangular mesh ($P_{ox}1$, $P_{ox}2$, $P_{ox}3$) (step S55).

Concretely, in the case where positions of three vertexes of the triangle $T_{ox}$ in the pre-deformation oxidation calculation triangular mesh: $P_{ox}1(X1_{ox}, Y1_{ox})$, $P_{ox}2(X2_{ox}, Y2_{ox})$, $P_{ox}3(X3_{ox}, Y3_{ox})$ moved into $(X1_{ox}^{move}, Y1_{ox}^{mvoe})$, $(X2_{ox}^{move}, Y2_{ox}^{move})$, $(X3_{ox}^{move}, Y3_{ox}^{move})$ by deformation due to oxidation, the position $P_{diff}$ of the vertex or the circumcenter in the diffusion calculation triangular mesh included in the $T_{ox}$: $P_{diff}(X_{diff}, Y_{diff})$ moves into $P_{diff}^{move}$ $(X_{diff}^{move}, Y_{diff}^{move})$ as the following equations (4) and (5).

$$X_{diff}^{move} = X1_{OX}^{move} + (X2_{OX}^{move} - X1_{OX}^{move})S + (X3_{OX}^{move} - X2_{OX}^{move})ST \quad (4)$$

$$Y_{diff}^{move} = Y1_{OX}^{move} + (Y2_{OX}^{move} - Y1_{OX}^{move})S + (Y3_{OX}^{move} - Y2_{OX}^{move})ST \quad (5)$$

Here, the S and T in the equations (4) and (5) is expressed by the following equations (6) and (7).

$$S = \{(X_{diff} - X1_{OX})(Y3_{OX} - Y2_{OX}) - \quad (6)$$
$$(X3_{OX} - X2_{OX})(Y_{diff} - Y1_{OX})\}/$$
$$\{(X2_{OX} - X1_{OX})(Y3_{OX} - Y2_{OX}) -$$
$$(X3_{OX} - X2_{OX})(Y2_{OX} - Y1_{OX})\}$$

$$T = \{(X2_{OX} - X1_{OX})(Y_{diff} - Y1_{OX}) - \quad (7)$$
$$(X_{diff} - X1_{OX})(Y2_{OX} - Y1_{OX})\}/$$
$$\{(X_{diff} - X1_{OX})(Y3_{OX} - Y2_{OX}) -$$
$$(X3_{OX} - X2_{OX})(Y_{diff} - Y1_{OX})\}$$

Subsequently, it is judged whether or not all of the vertexes and the circumcenters of the pre-deformation diffusion calculation triangular mesh have been moved (step S56). If NO, next position $P_{diff}$ of a vertex or a circumcenter of a triangle composing the pre-deformation diffusion calculation triangular mesh is arbitrarily chosen and process is returned to the step S52 (step S57). If YES, deformation of the pre-deformation diffusion calculation triangular mesh into the post-deformation diffusion calculation triangular mesh according to the deformation of the oxidation calculation triangular mesh is completed, and then post-deformation diffusion calculation control volumes are defined according to the post-deformation diffusion calculation triangular mesh, and the step S37 in FIG. 6 is completed (step S58).

Incidentally, in the process of the step S37 of FIG. 6 described in FIG. 8, all of the triangular elements $T_{oxS}$ composing the pre-deformation oxidation calculation triangular mesh were referred to in order to judge which one of the triangular elements $T_{oxS}$ includes the vertexes and circumcenters of the pre-deformation diffusion calculation triangular mesh, and considerably long calculation time is needed since the scale of necessary algorithm is as large as the order of $O(n^2)$ (n: the number of vertexes). However, in practical calculation, it is possible to execute high speed calculation using some methods such as well-known hash table method or hashing method. When the hash table method is applied to the step S37, the regions of the semiconductor device is previously partitioned into coarse rectangular elements and each triangular element $T_{ox}$ is previously registered corresponding to one of the coarse rectangular elements, and the coarse rectangular elements are used for reference, and thus calculation time is considerably shortened.

FIG. 9 is a flow chart showing the process of the step S41 of FIG. 6 in which the amount of the impurity material in the post-deformation diffusion calculation control volumes is fully transferred to the new diffusion calculation control volumes by executing AND operation. In the following, the steps involved in the process of the step S41 will be described.

First, a new diffusion calculation control volume lCVnew is arbitrarily chosen (step S61). Subsequently, a post-deformation diffusion calculation control volume ICVold corresponding to the chosen new diffusion calculation control volume ICVnew is chosen (step S62). Subsequently, AND operation is executed between the ICVnew and the ICVold, and the area $S_{AND}$ of the overlap between ICVnew and the ICVold is obtained (step S63).

Subsequently, the amount of the impurity material $D_{AND}$ in the overlap is obtained by multiplying the $S_{AND}$ and the impurity material concentration set on the post-deformation diffusion calculation triangular mesh in the step S38 of FIG. 6 (step S64). Subsequently, obtained $D_{AND}$ is added to the amount of impurity material Dnew in the new diffusion calculation control volume ICVnew (step S65).

Subsequently, it is judged whether or not the step S63 through the step S65 have been executed to all post-deformation diffusion calculation control volumes overlapping with the new diffusion calculation control volume (step S66). If NO, next post-deformation diffusion calculation control volume overlapping with the new diffusion calculation control volume is chosen, and process is returned to the step S63 in order to repeat the step S63 through the step S65 (step S69).

If YES, impurity material concentration on a vertex corresponding to the new diffusion calculation control volume ICVnew is obtained by dividing the resultant Dnew by the area of the new control volume ICVnew (step S67).

Subsequently, it is judged whether or not the aforementioned process has been executed to all new diffusion calculation control volumes (step S68). If NO, next new diffusion calculation control volume ICVnew is chosen, and process is returned to the step S62 in order to repeat the step S62 through the step S69 (step S70). If YES, the process of the step S41 in FIG. 6 is completed.

Figure 10:
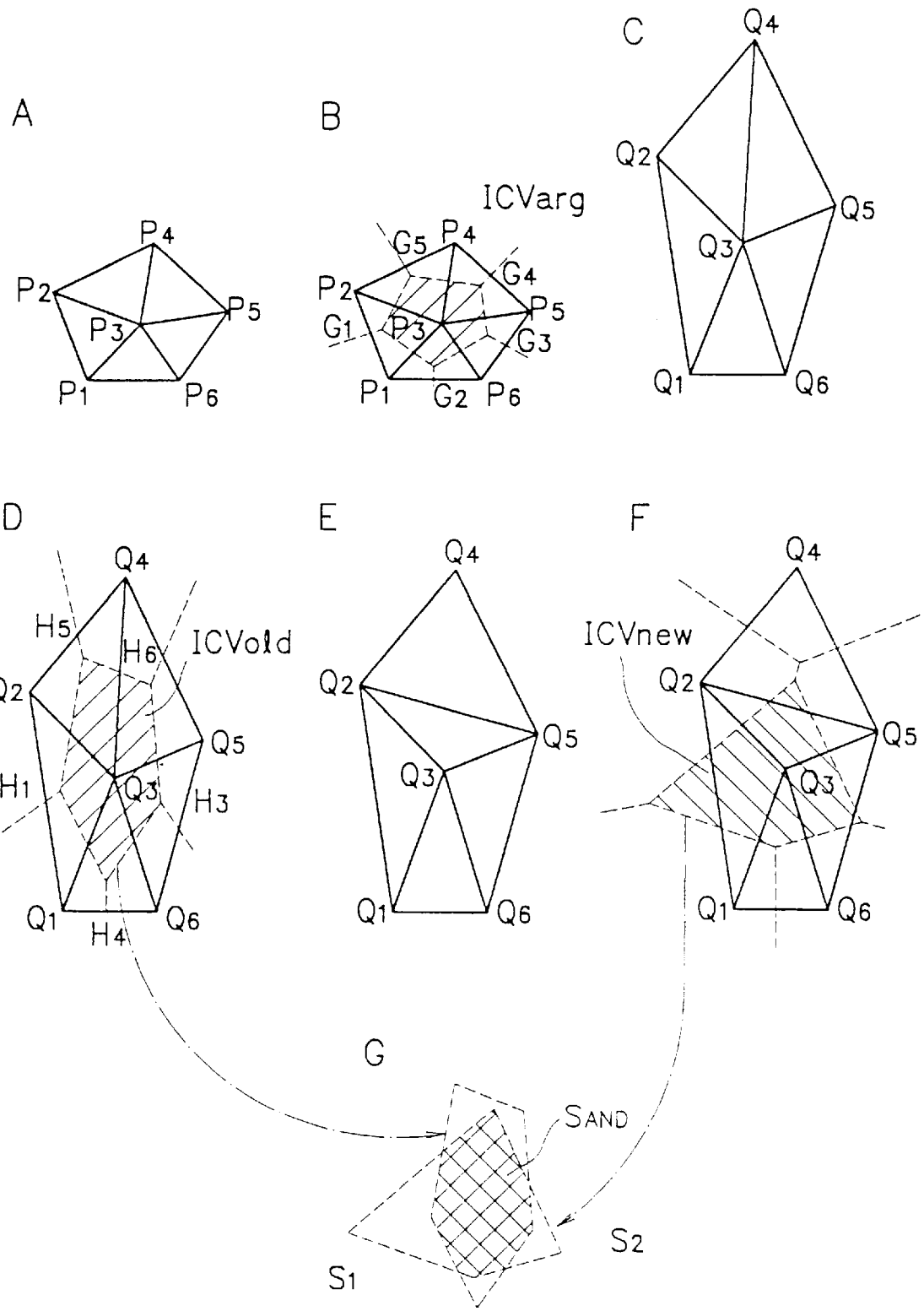
FIG. 10 is a schematic diagram for explaining variation of diffusion calculation triangular mesh and diffusion calculation control volumes according to the present invention.

FIG. 10 is a schematic diagram for explaining variation of the diffusion calculation triangular mesh and the diffusion calculation control volumes according to the present invention, in which A is pre-deformation diffusion calculation triangular mesh generated for the initial shape of a region of a semiconductor device guaranteeing Delaunay partitioning (step S31 of FIG. 6), B is a pre-deformation diffusion calculation control volume defined to a vertex of the pre-deformation diffusion calculation triangular mesh (step S32 of FIG. 6), C is post-deformation diffusion calculation triangular mesh which has been deformed according to deformation of the oxidation calculation triangular mesh due to oxidation (step S37 of FIG. 6), D is a post-deformation diffusion calculation control volume ICVold defined to the vertex of the post-deformation diffusion calculation triangular mesh (step S37 of FIG. 6), E is new diffusion calculation triangular mesh generated for deformed shape of the region of the semiconductor device guaranteeing Delaunay partitioning (step S39 of FIG. 6). Incidentally, although the same vertexes as those of the post-deformation diffusion calculation triangular mesh C are used in the new diffusion calculation triangular mesh E of FIG. 10 and only triangular elements are altered to guarantee the Delaunay partitioning requiring that no vertexes of other triangles should not exist in a circumscribed circle of a triangle, it is as well possible to generate the new diffusion calculation triangular mesh E using new vertexes. F is a new diffusion calculation control volume ICVnew defined to a vertex of the new diffusion calculation triangular mesh (step S40 of FIG. 6), and G is the overlap between the new diffusion calculation control volume ICVnew and the post-deformation diffusion calculation control volume ICVold. The AND operation in the step S63 of FIG. 9 is executed between the ICVnew and the ICVold, and the area $S_{AND}$ of the overlap is obtained (step S41 of FIG. 6, step S63 of FIG. 9).

As described above, according to the embodiment, as the process simulation method presently proposed by the present inventor, process simulation keeping on guaranteeing the Delaunay partitioning and keeping conservation of the gross dose of the impurity material due to introduction such as ion implantation is realized, even in the case where shapes of regions of the semiconductor device vary as time passes due to oxidation.

Furthermore, according to this embodiment, use of two triangular mesh, i.e. triangular mesh suitable for oxidation calculation and triangular mesh suitable for diffusion calculation, is made possible. Fine mesh can be defined in and around the silicon layer in the triangular mesh for oxidation calculation, and coarse mesh can be defined in and around the silicon layer in the triangular mesh for oxidation calculation, and thus the number of vertexes n in each triangular mesh is reduced to approximately 50%. The scale of necessary algorithm for oxidation calculation and diffusion calculation is expressed as 0(n). Therefore, calculation time for the process simulation can be reduced to approximately 50% in comparison with the case where single triangular mesh is used.

Figure 11:
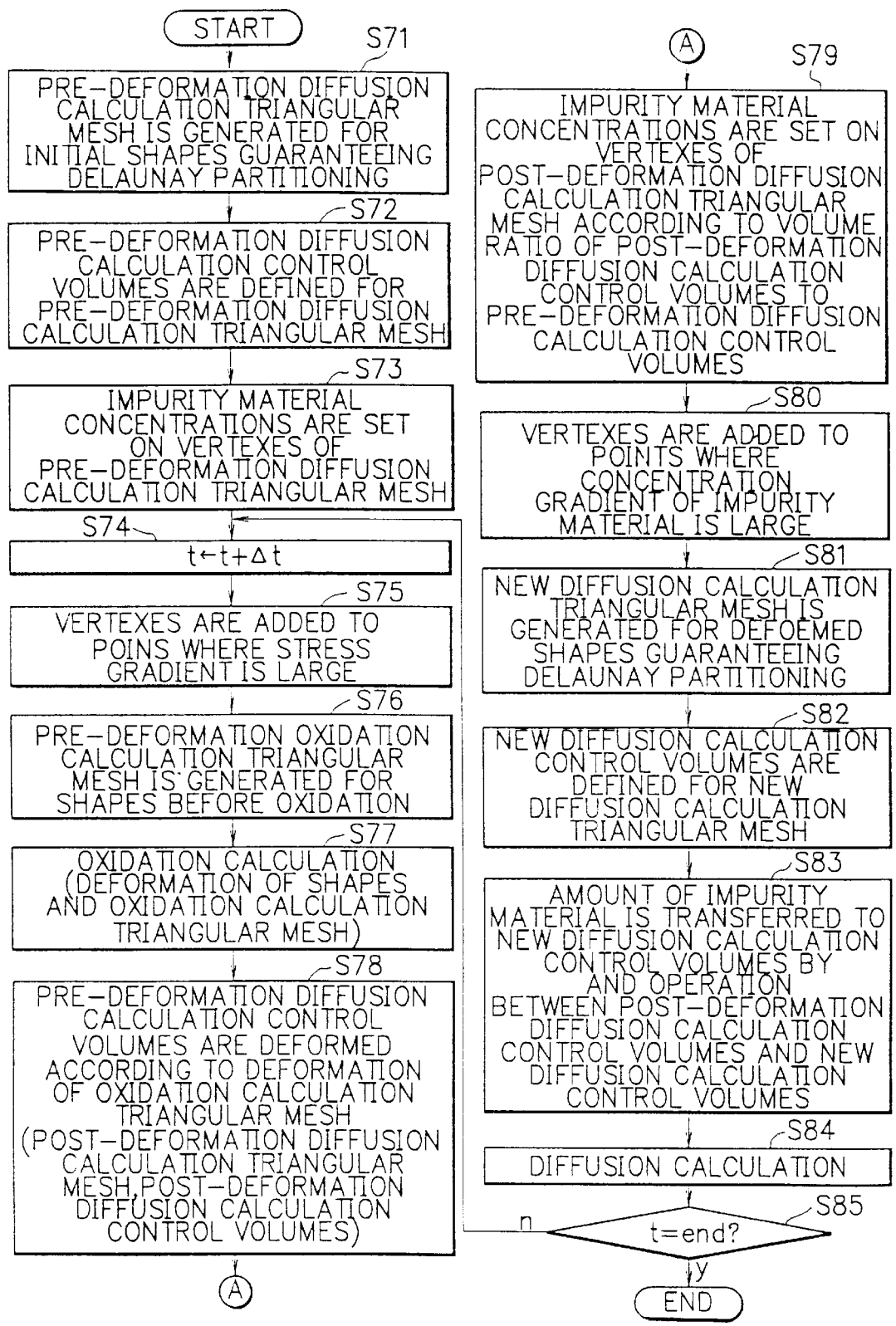
FIG. 11 is a flow chart showing the steps in the process simulation method according to another embodiment of the present invention.

FIG. 11 is a flow chart showing the steps in the process simulation method according to another embodiment of the present invention.

First, pre-deformation diffusion calculation triangular mesh is generated by the process simulator for initial shapes of regions of a semiconductor device, guaranteeing Delaunay partitioning (step S71).

Subsequently, pre-deformation diffusion calculation control volumes for the pre-deformation diffusion calculation triangular mesh are defined by the process simulator (step S72).

Subsequently, impurity material concentrations due to introduction by ion implantation etc. are set by the process simulator on each vertex of the pre-deformation diffusion calculation triangular mesh in the initial shapes of regions of the semiconductor device (step S73).

Subsequently, unit time Δt for oxidation (deformation) and diffusion is added to the time counted by the process simulator (step S74).

Subsequently, vertexes of the oxidation calculation triangular mesh are added to points where stress gradient is large (step S75).

Subsequently, pre-deformation oxidation calculation triangular mesh is generated by the process simulator for the shapes of regions before oxidation using the vertexes which has been added in the step S75, guaranteeing Delaunay partitioning (step S76).

Subsequently, oxidation calculation is executed and deformation of the oxidation calculation triangular mesh according to the oxidation calculation is executed by the process simulator (post-deformation oxidation calculation triangular mesh) (step S77).

Subsequently, the pre-deformation diffusion calculation control volumes corresponding to each vertex of the pre-deformation diffusion calculation triangular mesh are deformed according to the deformation of the oxidation calculation triangular mesh (post-deformation diffusion calculation control volumes) (step S78).

Subsequently, volume ratios of the post-deformation diffusion calculation control volumes to the pre-deformation diffusion calculation control volumes are obtained by the process simulator and impurity material concentrations are set on each vertex of the post-deformation diffusion calculation triangular mesh according to the obtained volume ratio and impurity material concentrations on each vertex of the pre-deformation diffusion calculation triangular mesh (step S79).

Subsequently, vertexes of the diffusion calculation triangular mesh are added to points where concentration gradient of the impurity material in the post-deformation diffusion calculation triangular mesh is large (step S80).

Subsequently, after the setting of impurity material concentrations after deformation, another diffusion calculation triangular mesh for deformed shapes of regions of the semiconductor device is newly generated by the process simulator using the vertexes which has been added in the step S80, guaranteeing the Delaunay partitioning (new diffusion calculation triangular mesh) (step S81).

Subsequently, new diffusion calculation control volumes corresponding to each vertex of the new diffusion calculation triangular mesh are defined by the process simulator (step S82).

Subsequently, the amount of the impurity material in the post-deformation diffusion calculation control volumes is fully transferred to the new diffusion calculation control volumes by the process simulator by executing AND operation between the post-deformation diffusion calculation control volumes and the new diffusion calculation control volumes (step S83).

Subsequently, diffusion calculation is executed by the process simulator using concentrations of the impurity material on vertexes of the new diffusion calculation triangular mesh and the new diffusion calculation control volumes, i.e. diffusion equation of the impurity material is solved (step S84).

Subsequently, it is judged whether or not predetermined time has elapsed. If NO, process is returned to the step S74 to repeat the step S74 through the step S84 until the predetermined time is counted by the process simulator. Incidentally, in the next loop after the process is returned to the step S74, the new diffusion calculation triangular mesh in the previous loop is used as pre-deformation diffusion calculation triangular mesh in the step S78 of the next loop. If YES, the process simulation is ended (step S85).

In the addition of vertexes of the oxidation calculation triangular mesh in the step S75, stresses of two adjacent vertexes of the oxidation calculation triangular mesh are compared and a vertex is added if the difference or the ratio between the two stresses is larger than a predetermined value. For example, it is possible to add vertexes to the midpoints of adjacent pairs of vertexes of the oxidation calculation triangular mesh if the stress ratio between the pair is larger than two.

In the addition of vertexes of the diffusion calculation triangular mesh in the step S80, impurity material concentrations of two adjacent vertexes of the diffusion calculation triangular mesh are compared and a vertex is added if the difference or the ratio between the two impurity material concentrations is larger than a predetermined value.

For example, it is possible to add vertexes to the midpoints of adjacent pairs of vertexes of the diffusion calculation triangular mesh if the ratio between impurity material concentrations of the pair is larger than ten.

Incidentally, although vertexes are added in the step S75 and the step S80, it is also possible to reduce the number of vertexes on the oxidation calculation triangular mesh or the diffusion calculation triangular mesh in order to shorten calculation time. For example, it is possible to delete vertexes on the oxidation calculation triangular mesh where stress gradient is lower than predetermined value, or delete vertexes on the diffusion calculation triangular mesh where concentration gradient of the impurity material is lower than predetermined value.

As described above, according to the second embodiment, it is possible to improve precision of oxidation calculation and diffusion calculation by adding vertexes of the oxidation calculation triangular mesh to points where stress gradient is large and by adding vertexes of the diffusion calculation triangular mesh to points where concentration gradient of the impurity material is large.

As set forth hereinabove, by the process simulation method according to the present invention, use of two triangular mesh, i.e. the oxidation calculation triangular mesh which is suitable for oxidation calculation and the diffusion calculation triangular mesh which is suitable for diffusion calculation, is made possible, and process simulation keeping on guaranteeing the Delaunay partitioning and keeping conservation of the gross dose of the impurity material due to introduction such as ion implantation is realized even if shapes of regions of the semiconductor device vary as time passes due to oxidation, with both high precision calculation and short calculation time. Calculation time for the process simulation is reduced to half in comparison with the case where single triangular mesh is used.

Furthermore, by adding vertexes of the oxidation calculation triangular mesh to points where stress gradient is large or by adding vertexes of the diffusion calculation triangular mesh to points where concentration gradient of the impurity material is large, precision of oxidation calculation or precision of diffusion calculation can be improved.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A computer-implemented process simulation method comprising the steps of:
   (1) generating pre-deformation diffusion calculation triangular mesh for initial shapes of regions of a semiconductor device guaranteeing Delaunay partitioning;
   (2) defining pre-deformation diffusion calculation control volumes for the pre-deformation diffusion calculation triangular mesh;
   (3) setting impurity material concentrations due to introduction by ion implantation on each vertex of the pre-deformation diffusion calculation triangular mesh in the initial shapes of regions of the semiconductor device;
   (4) generating oxidation calculation triangular mesh for the shapes of regions of the semiconductor device before oxidation;
   (5) executing oxidation calculation and deforming the oxidation calculation triangular mesh according to the oxidation calculation;
   (6) deforming pre-deformation diffusion calculation triangular mesh and pre-deformation diffusion calculation control volumes to post-deformation diffusion calculation triangular mesh and post-deformation diffusion calculation control volumes respectively according to the deformation of the oxidation calculation triangular mesh;
   (7) setting impurity material concentrations on each vertex of the post-deformation diffusion calculation triangular mesh according to impurity material concentrations on each vertex of the pre-deformation diffusion calculation triangular mesh and volume ratio of the post-deformation diffusion calculation control volume to the pre-deformation diffusion calculation control volume;
   (8) generating new diffusion calculation triangular mesh for deformed shapes of regions of the semiconductor device guaranteeing Delaunay partitioning;
   (9) defining new diffusion calculation control volumes for the new diffusion calculation triangular mesh;
   (10) fully transferring the amount of the impurity material in the post-deformation diffusion calculation control volumes to the new diffusion calculation control volumes by executing AND operation between the post-deformation diffusion calculation control volumes and the new diffusion calculation control volumes; and
   (11) executing diffusion calculation using the new diffusion calculation control volumes and the concentrations of the impurity material on vertexes of the new diffusion calculation triangular mesh,
   wherein the process between the step (4) and the step (11) for unit time $\Delta t$ is repeated until predetermined time is counted.

2. A computer-implemented process simulation method as claimed in claim 1, wherein the step (6) includes the steps of:
   (A1) choosing a position $P_{diff}$ of a vertex or a circumcenter of a triangle composing the pre-deformation diffusion calculation triangular mesh;
   (A2) choosing a triangle $T_{ox}$ composing the oxidation calculation triangular mesh before deformation;
   (A3) judging whether or not the chosen triangle $L_{ox}$ includes the chosen position $P_{diff}$;
   (A4) choosing next triangle $T_{ox}$ composing the oxidation calculation triangular mesh before deformation and returning process to the step (A3), if the judgment in the step (A3) is NO;
   (A5) moving the position $P_{diff}$ using movement of three vertexes of the triangle $T_{ox}$ of the oxidation calculation triangular mesh by deformation due to oxidation, if the judgment in the step (A3) is YES;
   (A6) judging whether or not all of the vertexes and the circumcenters of the pre-deformation diffusion calculation triangular mesh have been moved;

(A7) choosing next position $P_{diff}$ of a vertex or a circumcenter of a triangle composing the pre-deformation diffusion calculation triangular mesh and returning process to the step (A2), if the judgment in the step (A6) is NO; and (A8) defining post-deformation diffusion calculation control volumes for the resultant post-deformation diffusion calculation triangular mesh, if the judgment in the step (A6) is YES.

3. A computer-implemented process simulation method as claimed in claim 2, wherein in the step (A5), in the case where positions of the three vertexes of the triangle $T_{ox}$ in the oxidation calculation triangular mesh: $P_{ox}1(X1_{ox}, Y1_{ox})$, $P_{ox}2(X2_{ox}, Y2_{ox})$, $P_{ox}3(X3_{ox}, Y3_{ox})$ moved into $(X1_{ox}^{move}, Y1_{ox}^{move})$ $(X2_{ox}^{move}, Y2_{ox}^{move})$, $(X3_{ox}^{move}, Y3_{ox}^{move})$ by deformation due to oxidation, the position $P_{diff}$ of the vertex or the circumcenter in the diffusion calculation triangular mesh: $P_{diff}(X_{diff}, Y_{diff})$ is moved into $P_{diff}^{move}(X_{diff}^{move}, Y_{diff}^{move})$ as the following equations.

$$X_{diff}^{move} = X1_{OX}^{move} + (X2_{OX}^{move} - X1_{OX}^{move})S + (X3_{OX}^{move} - X2_{OX}^{move})ST$$

$$Y_{diff}^{move} = Y1_{OX}^{move} + (Y2_{OX}^{move} - Y1_{OX}^{move})S + (Y3_{OX}^{move} - Y2_{OX}^{move})ST$$

Here, $$S = \{(X_{diff} - X1_{OX})(Y3_{OX} - Y2_{OX}) - (X3_{OX} - X2_{OX})(Y_{diff} - Y1_{OX})\} / \{(X2_{OX} - X1_{OX})(Y3_{OX} - Y2_{OX}) - (X3_{OX} - X2_{OX})(Y2_{OX} - Y1_{OX})\}$$

$$T = \{(X2_{OX} - X1_{OX})(Y_{diff} - Y1_{OX}) - (X_{diff} - X1_{OX})(Y2_{OX} - Y1_{OX})\} / \{(X_{diff} - X1_{OX})(Y3_{OX} - Y2_{OX}) - (X3_{OX} - X2_{OX})(Y_{diff} - Y1_{OX})\}.$$

4. A computer-implemented process simulation method as claimed in claim 1, wherein the step (10) includes the steps of:

(B1) choosing a new diffusion calculation control volume;

(B2) choosing a post-deformation diffusion calculation control volume corresponding to the chosen new diffusion calculation control volume;

(B3) executing AND operation between the chosen new diffusion calculation control volume and the chosen post-deformation diffusion calculation control volume and obtaining the area $S_{AND}$ of the overlap between the two control volumes;

(B4) obtaining the amount $D_{AND}$ of the impurity material in the overlap by multiplying the $S_{AND}$ and the impurity material concentration set on the post-deformation diffusion calculation triangular mesh in the step (7);

(B5) adding obtained $D_{AND}$ to the amount of the impurity material in the new diffusion calculation control volume;

(B6) judging whether or not the step (B3) through the step (B5) have been executed to all post-deformation diffusion calculation control volumes overlapping with the new diffusion calculation control volume;

(B7) choosing next post-deformation diffusion calculation control volume overlapping with the new diffusion calculation control volume and returning process to the step (B3), if the judgment in the step (B6) is NO;

(B8) obtaining impurity material concentration on a vertex corresponding to the new diffusion calculation control volume by dividing the resultant amount of the impurity material in the new diffusion calculation control volume by the area of the new control volume, if the judgment in the step (B6) is YES;

(B9) judging whether or not the step (B2) through the step (B8) have been executed to all new diffusion calculation control volumes;

(B10) choosing next new diffusion calculation control volume and returning process to the step (B2), if the judgment in the step (B9) is NO; and (B11) finishing the process for the step (10), if the judgment in the step (B9) is YES.

5. A computer-implemented process simulation method comprising the steps of:

(1) generating pre-deformation diffusion calculation triangular mesh for initial shapes of regions of a semiconductor device guaranteeing Delaunay partitioning;

(2) defining pre-deformation diffusion calculation control volumes for the pre-deformation diffusion calculation triangular mesh;

(3) setting impurity material concentrations due to introduction by ion implantation on each vertex of the pre-deformation diffusion calculation triangular mesh in the initial shapes of regions of the semiconductor device;

(4) adding vertexes of the oxidation calculation triangular mesh to points where stress gradient is large;

(5) generating oxidation calculation triangular mesh for the shapes of regions of the semiconductor device before oxidation using the vertexes which has been added in the step (4);

(6) executing oxidation calculation and deforming the oxidation calculation triangular mesh according to the oxidation calculation;

(7) deforming pre-deformation diffusion calculation triangular mesh and pre-deformation diffusion calculation control volumes to post-deformation diffusion calculation triangular mesh and post-deformation diffusion calculation control volumes respectively according to the deformation of the oxidation calculation triangular mesh;

(8) setting impurity material concentrations on each vertex of the post-deformation diffusion calculation triangular mesh according to impurity material concentrations on each vertex of the pre-deformation diffusion calculation triangular mesh and volume ratio of the post-deformation diffusion calculation control volume to the pre-deformation diffusion calculation control volume;

(9) generating new diffusion calculation triangular mesh for deformed shapes of regions of the semiconductor device guaranteeing Delaunay partitioning;

(10) defining new diffusion calculation control volumes for the new diffusion calculation triangular mesh;

(11) fully transferring the amount of the impurity material in the post-deformation diffusion calculation control volumes to the new diffusion calculation control volumes by executing AND operation between the post-deformation diffusion calculation control volumes and the new diffusion calculation control volumes; and

(12) executing diffusion calculation using the new diffusion calculation control volumes and the concentrations of the impurity material on vertexes of the new diffusion calculation triangular mesh, wherein the process between the step (4) and the step (12) for unit time Δt is repeated until predetermined time is counted.

6. A computer-implemented process simulation method as claimed in claim 5, wherein each of the vertexes added in the step (4) is added to a midpoint of adjacent two vertexes of the oxidation calculation triangular mesh if the stress ratio between the adjacent two vertexes is larger than a predetermined value.

7. A computer-implemented process simulation method as claimed in claim 6, wherein the predetermined value is two.

8. A computer-implemented process simulation method comprising the steps of:

(1) generating pre-deformation diffusion calculation triangular mesh for initial shapes of regions of a semiconductor device guaranteeing Delaunay partitioning;

(2) defining pre-deformation diffusion calculation control volumes for the pre-deformation diffusion calculation triangular mesh;

(3) setting impurity material concentrations due to introduction by ion implantation on each vertex of the pre-deformation diffusion calculation triangular mesh in the initial shapes of regions of the semiconductor device;

(4) generating oxidation calculation triangular mesh for the shapes of regions of the semiconductor device before oxidation;

(5) executing oxidation calculation and deforming the oxidation calculation triangular mesh according to the oxidation calculation;

(6) deforming pre-deformation diffusion calculation triangular mesh and pre-deformation diffusion calculation control volumes to post-deformation diffusion calculation triangular mesh and post-deformation diffusion calculation control volumes respectively according to the deformation of the oxidation calculation triangular mesh;

(7) setting impurity material concentrations on each vertex of the post-deformation diffusion calculation triangular mesh according to impurity material concentrations on each vertex of the pre-deformation diffusion calculation triangular mesh and volume ratio of the post-deformation diffusion calculation control volume to the pre-deformation diffusion calculation control volume;

(8) adding vertexes of the diffusion calculation triangular mesh to points where concentration gradient of the impurity material is large;

(9) generating new diffusion calculation triangular mesh for deformed shapes of regions of the semiconductor device using the vertexes which has been added in the step (8) guaranteeing Delaunay partitioning;

(10) defining new diffusion calculation control volumes for the new diffusion calculation triangular mesh;

(11) fully transferring the amount of the impurity material in the post-deformation diffusion calculation control volumes to the new diffusion calculation control volumes by executing AND operation between the post-deformation diffusion calculation control volumes and the new diffusion calculation control volumes; and

(12) executing diffusion calculation using the new diffusion calculation control volumes and the concentrations of the impurity material on vertexes of the new diffusion calculation triangular mesh, wherein the process between the step (4) and the step (12) for unit time Δt is repeated until predetermined time is counted.

9. A computer-implemented process simulation method as claimed in claim 8, wherein each of the vertexes added in the step (8) is added to a midpoint of adjacent two vertexes of the diffusion calculation triangular mesh if the concentration ratio of the impurity material between the adjacent two vertexes is larger than a predetermined value.

10. A computer-implemented process simulation method as claimed in claim 9, wherein the predetermined value is ten.

11. A computer-implemented process simulation method using oxidation calculation triangular mesh for simulating deformation of regions of a semiconductor device due to oxidation, diffusion calculation triangular mesh for simulating diffusion of impurity materials introduced by ion implantation in the semiconductor device, and diffusion calculation control volumes defined to each vertex of the diffusion calculation triangular mesh, comprising the steps of:

(1) generating the diffusion calculation triangular mesh for shapes of regions of the semiconductor device before deformation due to oxidation guaranteeing Delaunay partitioning, generating the oxidation calculation triangular mesh for the shapes before deformation due to oxidation, and defining the diffusion calculation control volumes to each vertex of the diffusion calculation triangular mesh;

(2) setting impurity material concentrations on each vertex of the diffusion calculation triangular mesh in the initial shapes of regions of the semiconductor device;

(3) executing oxidation calculation and deforming the oxidation calculation triangular mesh according to the oxidation calculation;

(4) deforming the diffusion calculation triangular mesh and the diffusion calculation control volumes according to the deformation of the oxidation calculation triangular mesh in the step (3);

(5) altering the impurity material concentrations on each vertex of the diffusion calculation triangular mesh according to volume ratio of the diffusion calculation control volume after deformation to the diffusion calculation control volume before deformation;

(6) defining new diffusion calculation triangular mesh and corresponding new diffusion calculation control volumes for deformed shapes of regions of the semiconductor device guaranteeing Delaunay partitioning;

(7) fully transferring the amount of the impurity material in the diffusion calculation control volumes after deformation to the new diffusion calculation control volumes by executing AND operation between the diffusion calculation control volumes after deformation and the new diffusion calculation control volumes; and (8) executing diffusion calculation using the new diffusion calculation control volumes and the concentrations of the impurity material on vertexes of the new diffusion calculation triangular mesh, wherein the process between the step (3) and the step (8) for unit timeΔt is repeated until predetermined time is counted.

* * * * *